SUPERREGENERATIVE REACTANCE AMPLIFIER

Filed June 2, 1960

INVENTOR,
BERNARD B. BOSSARD
BY
Harry M. Saragovitz
ATTORNEY.

3,045,115
Patented July 17, 1962

3,045,115
SUPERREGENERATIVE REACTANCE AMPLIFIER

Bernard B. Bossard, Livingston, N.J., assignor to the United States of America as represented by the Secretary of the Army Filed June 2, 1960, Ser. No. 35,861
9 Claims. (Cl. 325—429)
(Granted under Title 35, U.S. Code (1952), sec. 266)

Figures 1, 2, 3, 4, 5, 6, 7:
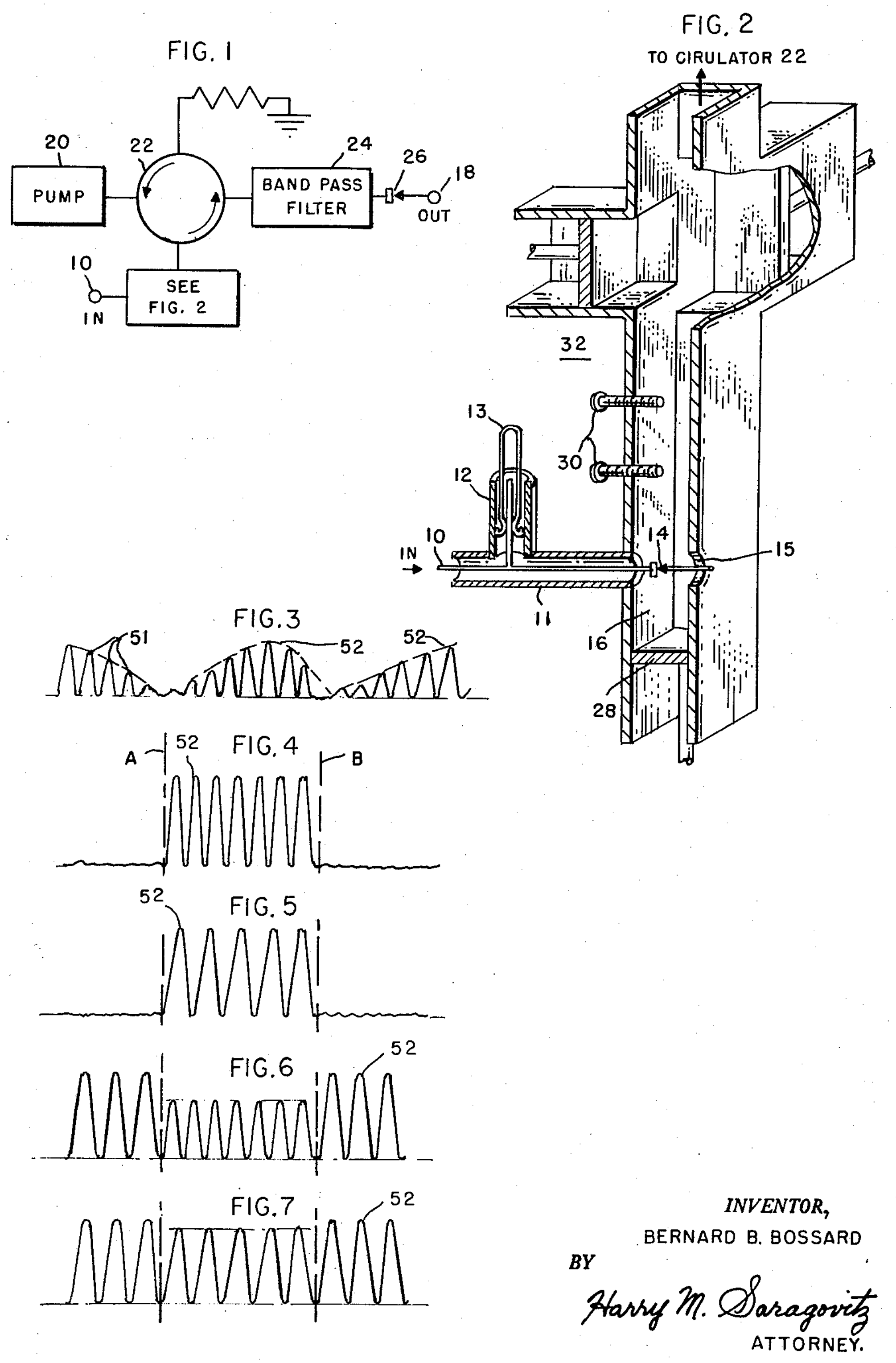

The invention described herein may be manufactured and used by or for the Government for governmental purposes, without the payment of any royalty thereon.

This invention relates to amplifiers and particularly to parametric amplifiers. More particularly, this invention relates to amplifiers, powered by a high frequency alternating current source, for amplifying a signal through the action of a non-linear element having a negative resistance. More particularly, this invention relates to superregenerative amplifiers of the above types.

Parametric amplifiers are well known and have been developed using both inductive and capacitive non-linear impedances. The recent developments in the variable capacity, varactor diodes have added considerable impetus to this form of parametric amplifier.

In the ordinary regenerative amplifier, the limit of gain is reached when the positive feedback is increased to the point where the amplifying device breaks into oscillation. In all normal parametric amplifiers it is essential that any negative resistance utilized in the circuit be held below the critical level whereat the circuit begins to oscillate. This may be accomplished by damping of the circuit as well as by actual control of the negative resistance but, in any case the standard parametric amplifiers will not operate if they break into oscillation.

It is therefore an object of this invention to provide an improved parametric amplifier using a variable capacity diode as the negative resistance element.

It is a further object of this invention to provide an improved parametric amplifier using a variable capacity diode as the negative resistance element. It is a further object of this invention to provide a parametric amplifier that is not limited in gain by the oscillation point of the circuit.

These and other objects are accomplished by connecting a very small capacity in series with the variable capacity diode of a parametric amplifier. Under certain conditions and with certain considerations, that will be described in detail in the following specification, the resultant circuit builds up oscillations and quenches them at a very high repetition rate. These self-squegging oscillations can be started by an incoming signal and the frequency of repetition can be controlled by the strength of the incoming signal; or the circuit can be held in a self-squegging state and the amplitude of the oscillations as well as the frequency of repetition can be controlled by the amplitude of the modulation of the incoming signals.

This superregenerative amplifier will be better understood and other and further objects of this invention will become apparent from the following specification and the drawings of which, FIGURE 1 shows a diagram of a circuit embodying this invention;

FIGURE 2 shows a perspective view partly in cross section of a typical structure incorporating this invention; and FIGURES 3, 4, 5, 6, and 7 show typical wave forms of signals existing within the circuit while in operation.

Referring now more particularly to FIGURE 1, a typical circuit is shown in block diagram form with the source of input signals 10 and a source of high frequency energy, or pump 20. The pump frequency signals are passed through a circulator 22 to the circuit of FIGURE 2 wherein they are combined with the input signals. The pump 20 also supplies the power necessary to sustain oscillation in the circuit and to provide amplification of the input signals.

The circuit of FIGURE 2 is the cross section of an actual physical layout of elements to perform this amplification. In this figure, the input 10 corresponds to the input 10 of FIGURE 1. This input is coupled through a coaxial line 11 to a coaxial tank 12.

The outer shield of the coaxial line 11 is also connected to the wall of the waveguide section 16 in a conventional manner. The inner conductor passes through the wall of the waveguide and projects into the waveguide section where it connects to the varactor diode 14.

The other terminal of the varactor diode also passes through the wall of the waveguide, but at a point opposite to that of the connection to the coaxial line. It is the spacing between the other terminal of the varactor and wall of the waveguide that provides the capacity 15 that is essential to the operation of this circuit.

The other elements of this structure are conventional and typical for certain types of parametric amplifiers. The waveguide section 16 is tuned to the frequency of the difference between the pump and the input frequencies. The tuning is accomplished by the plunger 28, the tuning screws 30, and the E—H tuner 32. Each of these elements is well known and need not be described here. Each of these elements contributes to the precise tuning of the idler tank to the correct frequency and to suitable modes of operation.

In operation, the input signal is applied to the tank circuit 12 which is a piece of coaxial line with one end opening onto the input waveguide and the other end terminating in a quarter wave short, tuned to the frequency of the incoming signals. This is called a coaxial tank and it has the same function at microwaves as a coil and condenser have at lower frequencies. The quarter wave tuned coaxial line effectively short circuits and cancels all incoming frequencies except those at its resonant frequency.

The source of pump frequency 20 may be any oscillator of suitable frequency and adequate power. A klystron was used in this typical embodiment at a frequency of 10,150 mc. This pump frequency is combined with the input frequency in the varactor diode. There are several ways of achieving this, at microwave frequencies, and also at lower frequencies. One microwave coupling, as shown in FIGURES 1 and 2, connects the pump frequency through a circulator 22 to the varactor 14 in the idler tank 16.

The circulator is a device that serves as a junction and as an isolator for several waveguides simultaneously. Each waveguide is coupled to the circulator in such a way that its energy is passed on to the next waveguide, whose energy is passed on to the next waveguide, and so on with the energy of the last waveguide (usually the fourth) being passed on to the first waveguide again. By this means, energy can be coupled from a first waveguide to a second without any energy from the second being able to feed back into the first waveguide. If the second waveguide is terminated so that energy is reflected back into the circulator, this energy is passed on to a third waveguide.

In this device, the circulator is used to couple the pump frequency from the pump 20 to the idler tank 16 and the difference frequency from the idler tank to a band pass filter 24 without permitting the difference frequency to feed back into the pump, or the band pass filter to effect the operation of the idler tank.

A typical, microwave circulator, suitable for this purpose, is described in the Bell Laboratories "Record" volume XXXV, Number 8 of August 1957, pages 293 to 297.

Another way of combining these frequencies would be to replace the variable shorting bar 28 with an input from the pump and to let the other end of the waveguide 16 connect through a band pass filter to the output. This and other ways of combining these elements to perform this function will not be shown here, to avoid confusion, but they are within the teachings of this invention.

It must be remembered that the main object here is to realize the simultaneous coexistence of oscillations at the input frequency, pump frequency, and their sum and difference frequencies within the same mixing entity. The significant factor is that these frequencies must be brought together across an ungrounded varactor diode to produce self-squegging. Any of several ways of achieving this would be applicable, among the techniques available at the frequencies involved.

The frequencies in the idler tank include the input and the very strong pump frequency as well as their sum and difference frequencies, developed by the mixing action of the non-linear element. All of these frequencies are passed, to some extent to the circulator and, ultimately, to be passed on to an output 18. This could be made a direct connection, but the very strong pump frequencies might dominate the difference frequency, which now carries the modulation component it is desired to detect.

In order to minimize this, the band pass filter 24 is connected between the circulator and the output 18. This filter is tuned to the difference frequency, which it passes while blocking the majority of the other frequencies, such as that of the pump, that are also present in the idler tank.

A rectifier 26 is connected to the band pass filter to provide a rectified output at 18. This detects the envelope of the starting and the stopping of the oscillations as shown in the typical examples in FIGURE 3.

The exceptional performance of this circuit is predicated on the fact that this circuit, oscillating at the frequency of the input tank circuit, can be made to increase the amplitude of its oscillations to a predetermined maximum level, and that this circuit will cause the oscillations to automatically decrease and extinguish themselves when their amplitude reaches this predetermined level. This produces, under certain conditions, repetitive trains of oscillations such as those produced by conventional, self-squegging oscillator circuits. The adjustment of the circuit parameters to produce this condition is fairly critical, and the presence of signal energy in the circuit can be made to start this self-squegging action or alter its characteristics with extreme sensitivity.

A first mode of operation of this circuit utilizes the ability of an incoming signal to drive this circuit from an oscillating condition to a self-squegging oscillating condition. In this mode of operation, the circuit is held in a state of oscillation very close to the threshold of self-squegging. At this point the circuit oscillates continuously, but it does not quench. The presence of a signal causes the amplitude of the oscillations to increase. When the amplitude of oscillations, which are at the frequency of the incoming signal, reaches a certain level, the oscillations will quench and not resume again until the original conditions of the circuit restore themselves.

The rate at which the oscillations build up and decay, or the quench frequency, must be substantially greater than the modulation of the incoming signals, or the repetition rate of any pulse frequencies being received.

The variation of the self-quench frequency will be proportional to the log of the relative strength of the incoming signal.

At the end of the signal pulse, the tank circuit returns to its normal oscillatory state with no self-squegging in this first mode of operation.

This mode of operation is illustrated in FIGURES 4 and 5 wherein the reception of a signal of the frequency of the coaxial tank begins at the instant A along the time axis of the wave forms in these figures. The actual incoming signal may be a simple CW pulse ending at the instant B. The wave form and other characteristics of such a pulse are well known and will not be shown here.

The oscillations generated and maintained in the circuit by the pump energy include oscillations at the frequency of the input tank circuit. These are the oscillations that, when influenced by an incoming signal of the same frequency, will build up and decay to produce a wave form somewhat like that of 51 of FIGURE 3 and a detected envelope of the self-squegging action somewhat like that of 52. The latter wave form will appear at the output terminal 18. This mode of operation gives an amplifier that is particularly suitable for use as a threshold device or as a limiter.

A second mode of operation utilizes the same circuit as a self-quenching superregenerative amplifier. This is accomplished by adjusting the parameters of the circuit, past the adjustment described for the first mode of operation, and until the circuit is continuously self-squegging. In the second mode of operation the effect of an incoming signal is to make the circuit more sensitive to the squegging function and to cause the quenching action to begin sooner. The resultant squegging will be of a higher repetition rate and of a lower amplitude.

The second mode of operation is illustrated in the FIGURES 6 and 7. In these figures the incoming signal may be again considered to start and stop at the same instants A and B along the time axis as those used in FIGURES 4 and 5. These times are indicated by the dotted lines in all cases. In FIGURES 6 and 7 the detected output of the building up and the quenching of the oscillation in the circuit is again shown. In these figures it is seen that the recurrence or quench frequency is higher and the detected output is of less amplitude during the reception of signals.

In FIGURE 6 the amplitude of the detected envelopes of the quench frequency is less during the interval of the reception of the incoming signals than the amplitude shown for the same condition in FIGURE 7. This indicates that the signals being received for the condition illustrated in FIGURE 6 are greater than the incoming signals being received for the condition illustrated in FIGURE 7. This illustrates the fact that stronger incoming signals have a greater effect on the self-squegging function of the oscillations. The larger the incoming signals, the smaller the amplitude of squegging oscillations.

The theory of operation of this circuit is not easy to describe because there is no known method nor is there any test procedure or instrument that can indicate the actual behavior of the electronic elements of this circuit under actual operating conditions at these microwave frequencies. There may even be more than one logical explanation of this phenomenon.

In actual operation of this circuit, it appears that the diode is acting in a manner similar to a squegging triode oscillator, as has been noted. This is actually an oscillation, apparently at the input frequency, that builds up in amplitude fairly gradually until certain circuit parameters are altered enough to cause the oscillations to quench. As they quench, the parameters restore themselves to their original condition and the oscillations again begin to build up to repeat the cycle.

It would appear that the build up of oscillations also builds up the bias across the varacter diode to change its negative resistance characteristic, or its bias controlled capacitance, or both. The change in negative resistance would decrease the gain of the circuit until it no longer supports oscillation, while the change in the capacitance of the diode would de-tune the circuit until it no longer supports oscillation. Either, or both, of these effects could cause the quenching of the oscillations. The restoration of the circuit to its original condition, after the oscillations have been quenched, would cause it to oscillate again. The amplitude and period of the quench frequency wave form is inversely proportional to pump power.

The oscillations could be made to build up from the decaying oscillations of the preceding cycle of quench. The sensitivity of this circuit is at its greatest when the oscillations are being completely quenched. A not completely quenched oscillation results in a great reduction of sensitivity.

The starting and the quenching of the oscillations may follow a very wide variety of wave forms. The build up of oscillations may be gradual and the stopping may be sudden—or vice versa—to produce saw tooth quench frequency wave forms. The build up of oscillations may be gradual and the quenching also gradual to provide still another wave form which may gradually approach a sine wave form, although the decay will usually be faster than the rise time, as illustrated by the quench frequency wave forms 52 in FIGURE 3.

The best results that have been obtained with this device have been with the self-squegging action approaching a sine wave form, or exponential wave form of the quench frequency, since the amount of noise that appears at the peaks of the quench frequency wave forms is greater for the sharp wave forms than for the exponential wave forms.

Typical quench frequency wave forms appear in each of the FIGURES 4 through 7. These wave forms are the ones detected by the rectifier 26 and appearing as the output of the amplifier. FIGURE 3 shows two typical cycles of oscillation build up and decay to provide this quench frequency wave form. The repetition of this build up and decay, as in the envelope 52, would be in the order of 1 mc. per second while the frequency of the actual oscillation would be in the order of 1,450 megacycles per second. The actual frequency that is amplified and detected is, of course, the difference between the pump frequency, which is constant and need not be shown, and that of the actual oscillations. The wave forms of FIGURE 3 are merely illustrative, since they could not, possibly, be shown to scale.

In a typical embodiment of this circuit, an "L" band variable reactance amplifier with a lower sideband, regenerative gain of 17 db and a bandwidth of 3 mc./sec., exhibited a gain of 72 db, with a slight increase in bandwidth, when operated as a superregenerative amplifier. The signal frequency was 1450 mc./sec., and the pumping was done at 10,150 mc./sec. The overall receiver noise figure was approximately 5 db as determined by a stable minimum discernible signal level of −104 dbm. This noise figure is higher than theory. Assuming no shot noise, the superregenerative amplifier should have a noise figure lower than that of an ordinary parametric amplifier.

The amplifier was first operated with a signal at a subharmonic of the pump frequency injected into the coaxial tank. A signal pulse of 10 microseconds was used. The circuit could be placed on the threshold of relaxation oscillations or self-squegging by varying either the pump power or tuning the idler tank. The output of this amplifier was always constant in amplitude and polarity regardless of signal strength, when operating in the first mode of operation.

When operating in the second mode of oscillations, as a self-quenched superregenerative amplifier with the self-squegging occurring continuously, the presence of the 10 microsecond signal pulse in the coaxial tank and at the frequency of the coaxial tank oscillations caused the self-quenched oscillations to decrease in amplitude. A minimum discernible signal of −104 dbm was measured at a signal bandwidth of 3 mc./sec., indicating an overall receiver noise figure of approximately 5 db. The damping effect appeared to change linearly with signal strength through a dynamic range of 70 db.

The receiver used in the typical embodiment of this invention is essentially composed of a mesa type silicon varactor diode made by the Bell Telephone Laboratories. The diode has a zero bias capacitance of 1.60 unf. and a series resistance of 2.78 ohms. The cut-off frequency of the diode is 81.0 kilomegacycles/sec. Another typical varactor diode that could be used in this circuit is the SC43X, manufactured by the Microwave Associates. The pumping source was a 2K–39 Klystron.

What is claimed is:

1. A parametric amplifier comprising an input tank circuit, a pump frequency generator, an idler tank circuit and a non-linear element; a source of input signals connected to said input circuit, said idler tank circuit coupled to said input tank circuit, and said pump frequency generator coupled to said input tank and idler tank circuit; said non-linear element coupled to said idler tank, a condenser connected in series with said non-linear element, said condenser causing said parametric amplifier to function in a manner similar to a superregeneative amplifier.

2. A superregenerative parametric amplifier comprising a source of input signals, an input tank circuit tuned to the frequency of said input signals, a pump frequency generator connected to said input tank circuit, a non-linear element and a condenser connected in series and coupled to said input tank circuit, an idler tank circuit connected across said input tank circuit and an output circuit connected to said idler tank circuit for detecting the amplified superregenerative signals.

3. An amplifier comprising a source of input signals, an input tank circuit resonant at the frequency of said source of input signals, a pump generator for producing a frequency much greater than that of said source of input signals, an idler tank circuit resonant at the frequency of the difference between the frequency of said pump and that of said source of input signals, a non-linear element for mixing said pump and said input frequencies, means for coupling said input tank circuit and said pump frequency generator to said idler tank circuit and said non-linear element, a condenser connected in series with said non-linear element across said idler tank circuit, said condenser producing superregenerative oscillations in said circuit.

4. An amplifier comprising means for receiving input signals, means for generating a relatively high pump frequency coupled to said means for receiving input signals and causing it to oscillate at the frequency of said input signals, non-linear detecting means for mixing said pump frequency with said input signal frequency to produce an amplified difference frequency, means for receiving said amplified difference frequency, and a condenser means connected in series with said non-linear detecting means, said condenser means causing said circuit to function in a manner similar to a superregenerative amplifier.

5. An amplifier as in claim 4 wherein said means for receiving input signals is a quarter wave coaxial tank.

6. An amplifier as in claim 4 wherein said means for receiving said amplified difference frequency is a tuned waveguide section resonant at said difference frequency.

7. An amplifier as in claim 4 wherein said non-linear detecting means is a varactor diode having negative resistance characteristics.

8. An amplifier comprising a coaxial tank resonant at the frequency of the incoming signals, a klystron pump for generating high frequency alternating currents, an idler tank waveguide section tuned to the frequency of the difference between said frequency of the incoming signals and that of said high frequency alternating currents, a band pass filter tuned to said difference frequency, a circulator means for coupling said klystron pump to said waveguide section and said waveguide section to said band pass filter, an output circuit, a diode detector connecting said band pass filter to said output circuit, a varactor diode positioned in said waveguide section to mix said incoming signal frequencies with said klystron pump alternating currents, said coaxial tank connected to said varactor diode, and a condenser connected in series with said varactor diode to cause the amplifier to oscillate in a self-squegging manner controllable by said incoming signals.

9. A parametric amplifier having a source of input signals at a given frequency, a source of high frequency pump energy, and a means for detecting the difference frequency between said pump and input frequencies, comprising a rectangular waveguide section having one end connected to said means for detecting the difference frequency, a variable shorting means in the other end, and E—H tuning stubs and tuning screws projecting through the walls of said waveguide for tuning said waveguide to said difference frequency; a first coaxial line having one end connected to said source of input signals, the other end of its outer conductor shorted to one wall of the waveguide, and the other end of its center conductor projecting through the said one wall into said waveguide; a varactor diode, positioned inside of said waveguide, having one terminal connected to said center conductor, and the other terminal passing through an opening in the wall of said waveguide opposite to said first coaxial cable; and a second coaxial cable projecting from said first coaxial cable having its conductors connected to those of said first conductor at one end and means for providing a quarter wave short, tunable to said input frequency, between the conductors at the other end of said second coaxial cable.

References Cited in the file of this patent

Younger et al.: "Parametic Amplifiers as Superregeneartive Dectors," Proceedings of the IRE, July 1959, pages 1271–1272.